(12) United States Patent
Miyake

(10) Patent No.: US 11,538,733 B2
(45) Date of Patent: Dec. 27, 2022

(54) ELECTRONIC DEVICE

(71) Applicant: DENSO CORPORATION, Kariya (JP)

(72) Inventor: Toshihiro Miyake, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/919,330

(22) Filed: Jul. 2, 2020

(65) Prior Publication Data

US 2021/0013121 A1   Jan. 14, 2021

(30) Foreign Application Priority Data

Jul. 10, 2019   (JP) .............................. JP2019-128739

(51) Int. Cl.

| | | |
|---|---|---|
| *H01L 23/373* | (2006.01) | |
| *C22C 9/00* | (2006.01) | |
| *C22C 5/02* | (2006.01) | |
| *C22C 21/00* | (2006.01) | |
| *H01L 23/00* | (2006.01) | |
| *H01L 23/495* | (2006.01) | |

(52) U.S. Cl.

CPC ............ *H01L 23/3735* (2013.01); *C22C 5/02* (2013.01); *C22C 9/00* (2013.01); *C22C 21/00* (2013.01); *H01L 23/3736* (2013.01); *H01L 23/49579* (2013.01); *H01L 24/29* (2013.01); *H01L 24/32* (2013.01); *H01L 2924/351* (2013.01)

(58) Field of Classification Search

CPC ... H01L 23/3735; H01L 23/36; H01L 21/568; H01L 21/76895; H01L 2224/81; H01L 2224/81815

See application file for complete search history.

(56) References Cited

U.S. PATENT DOCUMENTS

| | | | | |
|---|---|---|---|---|
| 6,529,380 B1 * | 3/2003 | Kono | ...................... | H01L 24/32 438/117 |
| 8,072,070 B2 * | 12/2011 | Lee | ......................... | H01L 25/50 257/737 |
| 8,242,011 B2 * | 8/2012 | Lim | ......................... | H01L 24/13 438/613 |

(Continued)

FOREIGN PATENT DOCUMENTS

| | | |
|---|---|---|
| JP | 2002-043779 A | 2/2002 |
| JP | 2003-197825 A | 7/2003 |

(Continued)

*Primary Examiner* — Marcos D. Pizarro
*Assistant Examiner* — Quinton A Brasfield
(74) *Attorney, Agent, or Firm* — Posz Law Group, PLC

(57) ABSTRACT

An electronic device includes a metal member and a connected member. A metal connecting layer is provided between a lower-side surface of the metal member and an upper-side surface of the connected member, to connect the metal member and the connected member to each other. The metal connecting layer includes at least one of metal films, each of which is made of gold or gold alloy. A thickness of the metal connecting layer in an opposing area between the metal member and the connected member is smaller than a flatness of each of the lower-side surface and the upper-side surface. A rust-preventing film is formed on a side wall of the metal member in such a way that the rust-preventing film extends from an outer periphery of the metal connecting layer to a position away from the outer periphery by a predetermined distance.

11 Claims, 3 Drawing Sheets

(56) References Cited

U.S. PATENT DOCUMENTS

| | | | |
|---|---|---|---|
| 10,199,467 B2* | 2/2019 | Kikuchi | H01L 29/7786 |
| 2009/0126903 A1* | 5/2009 | Kuibira | H05K 7/20963 |
| | | | 165/67 |
| 2010/0090318 A1* | 4/2010 | Hsu | H01L 24/03 |
| | | | 257/621 |
| 2010/0157629 A1 | 6/2010 | Yoshikawa | |
| 2010/0158059 A1 | 6/2010 | Yoshikawa | |
| 2013/0000978 A1* | 1/2013 | Choi | H01L 24/13 |
| | | | 174/94 R |
| 2016/0190417 A1* | 6/2016 | Ichikawa | C04B 37/00 |
| | | | 438/26 |
| 2018/0190606 A1* | 7/2018 | Williamson | H01L 24/05 |
| 2021/0202350 A1 | 7/2021 | Eisele | |

FOREIGN PATENT DOCUMENTS

| | | |
|---|---|---|
| JP | 2008-207221 A | 9/2008 |
| JP | 2013-055218 A | 3/2013 |

* cited by examiner

ELECTRONIC DEVICE

CROSS REFERENCE TO RELATED APPLICATION

This application is based on Japanese Patent Application No. 2019-128739 filed on Jul. 10, 2019, the disclosure of which is incorporated herein by reference.

FIELD OF TECHNOLOGY

The present disclosure relates to an electronic device.

BACKGROUND

A semiconductor device is known in the art, according to which a semiconductor element is provided on an upper-side surface of a circuit board and a heat radiating member is connected to a lower-side surface of the circuit board via a metal connecting member made of metal material, such as, gold or gold alloy. An upper-side surface of the heat radiating member is opposed to and in contact with an entire area of the lower-side surface of the circuit board. In the above structure, stresses, which includes a thermal stress, vibration from an outside and son on, may concentrate on an end portion of an opposing area between the circuit board and the heat radiating member.

SUMMARY OF THE DISCLOSURE

It is an object of the present disclosure to provide an electronic device, which is resistant to corrosion.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION OF THE EMBODIMENTS

Figure 1:
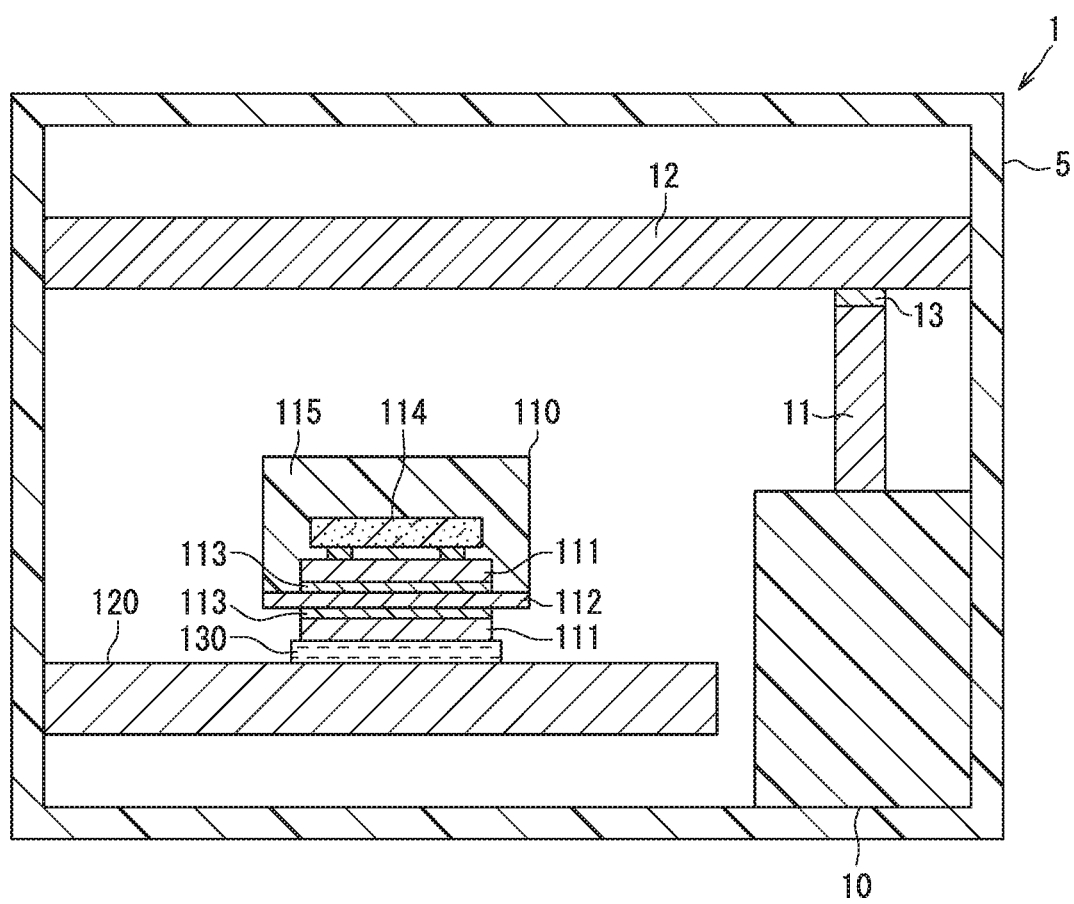
FIG. 1 is a schematic cross-sectional view showing an electronic device according to a first embodiment of the present disclosure.

The present disclosure will be explained hereinafter by way of multiple embodiments and/or modifications with reference to the drawings. The same reference numerals are given to the same or similar structures and/or portions in order to avoid repeated explanation.

First Embodiment

A structure of an electronic device 1 according to a first embodiment will be explained with reference to FIG. 1.

(Electronic Device)

As shown in FIG. 1, the electronic device 1 includes a casing 5, an electronic component 10, a bus bar 12, a semiconductor module 110, a cooling unit 120 and so on. The casing 5 accommodates therein the electronic component 10 and the semiconductor module 110. The casing 5 is made of metal material or resin material.

The electronic component 10 has a lead wire 11 outwardly protruding from a body of the electronic component 10. The lead wire 11 is an outside connecting terminal. The bus bar 12 is a wiring pattern of a plate shape. Each of the lead wire 11 and the bus bar 12 is made of metal material having a high electrical conductivity, such as, copper or the like. The lead wire 11 is connected to the bus bar 12 via a metal connecting layer 13. The lead wire 11 and the bus bar 12 are electrically connected to each other by the metal connecting layer 13. The metal connecting layer 13 includes a film made of gold or gold alloy. The lead wire 11 and the bus bar 12 are connected to each other at room temperature.

The semiconductor module 110 includes a heat radiating unit having a heat sink 111 and an insulating plate 112, a semiconductor chip 114, and an encapsulating resin body 115. The heat radiating unit has a pair of heat sinks 111 and the insulating plate 112 is arranged between the heat sinks 111. Each of the heat sinks 111 is connected to the insulating plate 112 via a metal connecting layer 113. The metal connecting layer 113 includes a film made of gold or gold alloy. Each of the heat sinks 111 and the insulating plate 112 are connected to each other at room temperature. The insulating plate 112 electrically insulates an upper-side heat sink 111 on a side closer to the semiconductor chip 114 from a lower-side heat sink 111 on an opposite side away from the semiconductor chip 114. The insulating plate 112 is made of ceramic material, such as, silicon nitride, aluminum nitride, silicon carbide and so on.

The semiconductor chip 114 is located on the upper-side heat sink 111. The semiconductor chip 114 is located on an upper-side of the upper-side heat sink 111, which is an opposite side to a lower-side of the upper-side heat sink 111 in contact with the insulating plate 112. The semiconductor chip 114 is connected to the heat sink 111. The heat sink 111, to which the semiconductor chip 114 is connected, radiates heat generated at the semiconductor chip 114. The heat sink 111, to which the semiconductor chip 114 is connected, may be used as a part of a wire. In such a case, the heat sink 111 is electrically connected to a wiring member (not shown). The lower-side heat sink 111, to which the semiconductor chip 114 is not connected, is connected to the cooling unit 120 via a heat transfer member 130, such as, heat radiating gel, heat radiating grease, a heat radiating sheet and so on.

The encapsulating resin body 115 encapsulates the semiconductor chip 114. In the present embodiment, the encapsulating resin body 115 encapsulates an entire area of the upper-side surface of the insulating plate 112, the upper-side heat sink 111 to which the semiconductor chip 114 is connected, and the semiconductor chip 114 itself. The encapsulating resin body 115 is resin body made of epoxy resin. The encapsulating resin body 115 is formed by a transfer molding process, a potting process or the like.

The cooling unit 120 is also referred to a heat exchanger. A passage is formed in the cooling unit 120, through which refrigerant flows. Water or ammonia, which changes its phase, or ethylene glycol, which does not change its phase, can be used as the refrigerant for the cooling unit 120. The semiconductor module 110 is located on the cooling unit 120 via the heat transfer member 130.

(Connecting Structure by Metal Connecting Layer)

Figure 2:
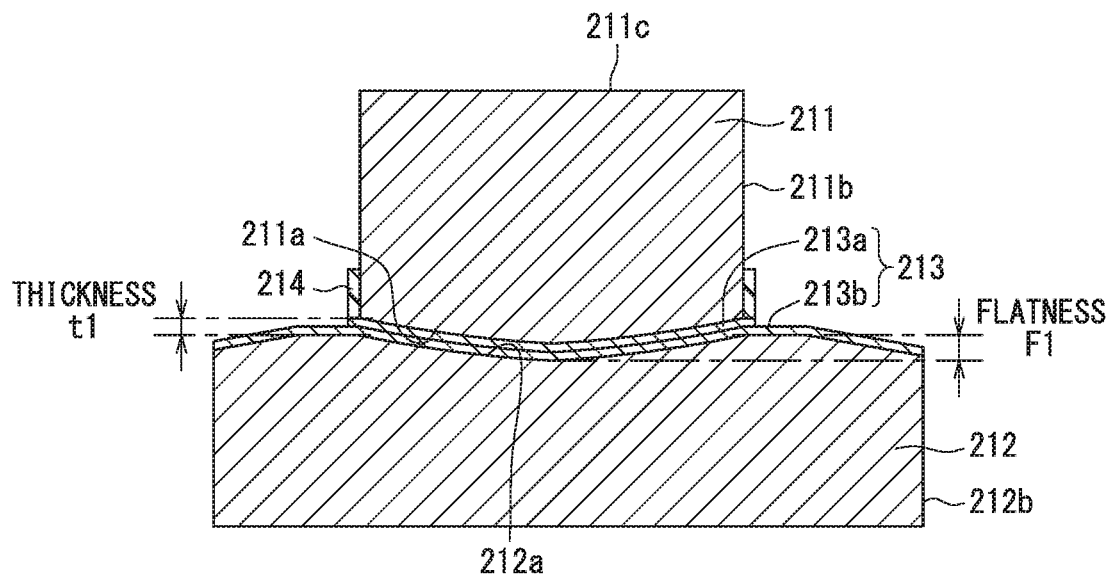
FIG. 2 is a schematic cross-sectional view showing a connecting structure between a metal member and a connected member.

A connecting structure for two parts by a metal connecting layer will be explained with reference to FIG. 2. The connecting structure hereinafter explained will be applied to a connecting structure between the lead wire 11 and the bus bar 12 by the metal connecting layer 13 or applied to a connecting structure between the heat sink 111 and the insulating plate 112 by the metal connecting layer 113. FIG. 2 shows a connecting structure between a metal member 211 and a connected member 212 by a metal connecting layer 213. The electronic device includes the metal member 211, the connected member 212 and the metal connecting layer 213.

The metal member 211 is made of material, such as, copper, copper alloy, aluminum or aluminum alloy. The connected member 212 is located at a position on a lower-side surface 211a of the metal member 211. The metal member 211 has a side surface 221b extending from the lower-side surface 211a and an upper-side surface 211c, which is an opposite side surface of the lower-side surface 211a.

The connected member 212 is connected to the metal member 211 via the metal connecting layer 213. The connected member 212 is made of material, such as, pure metal including copper, aluminum and so on, metal alloy including copper alloy, aluminum alloy and so on, ceramics including silicon nitride, aluminum nitride, silicon carbide and so on, semiconductor including silicon, resin or the like. The connected member 212 may be made of the different material from that of the metal member 211 or made of the same material to that of the metal member 211.

The connected member 212 has an upper-side surface 212a, which is opposed to the lower-side surface 211a of the metal member 211. The lower-side surface 211a of the metal member 211 is an opposing surface to the connected member 212, while the upper-side surface 212a of the connected member 212 is an opposing surface to the metal member 211. The upper-side surface 212a of the connected member 212 is opposed to an entire surface area of the lower-side surface 211a of the metal member 211. The connected member 212 has a side surface 212b extending from the upper-side surface 212a. In the present embodiment, a surface area of the upper-side surface 212a of the connected member 212 is made to be larger than a surface area of the lower-side surface 211a of the metal member 211. When viewed the metal member 211 and the connected member 212 in a thickness direction of the metal connecting layer 213, the upper-side surface 212a of the connected member 212 entirely covers the lower-side surface 211a of the metal member 211. The thickness direction of the metal connecting layer 213 is also referred to as an opposing direction of the metal member 211 and the connected member 212 or an arrangement direction of the metal member 211 and the connected member 212.

In the connecting structure between the lead wire 11 and the bus bar 12, the lead wire 11 corresponds to the metal member 211 and the bus bar 12 corresponds to the connected member 212. In a similar manner, in the connecting structure between the heat sink 111 and the insulating plate 112, the heat sink 111 corresponds to the metal member 211 and the insulating plate 112 corresponds to the connected member 212.

The metal connecting layer 213 connects the lower-side surface 211a of the metal member 211 to the upper-side surface 212a of the connected member 212. The metal connecting layer 213 includes metal films 213a and 213b, each of which is made of material, such as, gold or gold alloy. Each of the metal films 213a and 213b is also referred to as a metal layer. An upper-side metal film 213a is formed in an entire surface area of the lower-side surface 211a of the metal member 211. A lower-side metal film 213b is formed in an entire surface area of the upper-side surface 212a of the connected member 212. When viewed them in the thickness direction, the lower-side metal film 213b entirely covers first metal film 213a.

Each of the metal films 213a and 213b is formed by a sputtering process. Each of the metal films 213a and 213b has a thickness of some nanometers (nm), for example, several tens of nanometers. A mirror finishing process is carried out, for example, by a CMP (Chemical Mechanical Polishing) process, for the lower-side surface 211a of the metal member 211 and the upper-side surface 212a of the connected member 212. Then, the upper-side and the lower-side metal films 213a and 213b are formed by the sputtering process. The upper-side and the lower-side metal films 213a and 213b are contacted with each other in an atmospheric condition and at a room temperature. Accordingly, the upper-side and the lower-side metal films 213a and 213b are connected to each other.

The metal connecting layer 213 includes the upper-side and the lower-side metal films 213a and 213b in an opposing area between the metal member 211 and the connected member 212. The metal connecting layer 213 has the lower-side metal film 213b in a surface area of the connected member 212 other than the opposing area (hereinafter, a non-opposing area). Therefore, a thickness of the metal connecting layer 213 in the opposing area is different from that of the non-opposing area. The thickness "t1" of the metal connecting layer 213 in the opposing area is smaller than a flatness "Fl" of the lower-side surface 211a of the metal member 211 as well as a flatness "Fl" of the upper-side surface 212a of the connected member 212. The thickness t1 has a value of some nanometers (nm), for example, several tens of nanometers. The flatness has a value of a micrometer, for example, 1 to 3 micrometers (μm). Each of the metal connecting layers 13 and 113 in FIG. 1 corresponds to the metal connecting layer 213 in FIG. 2. In FIG. 1, each of the metal connecting layers 13 and 113 is shown in a simplified manner.

The electronic device has a rust-preventing film 214. The rust-preventing film 214 is formed on a part of the side surface 211b of the metal member 211 in such a surface area extending from a boundary portion between the metal member 211 and the connected member 212. In other words, the rust-preventing film 214 extends from an outer periphery of the upper-side metal film 213a (an outer periphery of the opposing area) to a position, which is separated from the metal connecting layer 213 by a predetermined distance in a thickness direction of the metal connecting layer 213 (an upward direction of FIG. 2). The rust-preventing film 214 prevents corrosion of metal. The rust-preventing film 214 is made of material, for example, benzotriazole or derivative thereof. In the present embodiment, the rust-preventing film 214 continuously surrounds the part of the side surface 211b of the metal member 211 along the periphery of the opposing area. The rust-preventing film 214 is formed on the part of the 211b of the metal member 211, so that it extends from the metal connecting layer 213 in the thickness direction by the predetermined distance.

The rust-preventing film 214 is formed before the mirror finishing process. In this case, the upper-side metal film 213a is formed on a lower-side end of the rust-preventing film 214. In FIG. 1, the rust-preventing film 214 is omitted.

In a connecting structure (a connecting coupling) of two members, thermal stress, external vibration and so on may applied to a connecting portion. The thermal stress is a combined stress of a first thermal stress and a second thermal stress. The first stress corresponds to a stress, which is generated by an expansion and/or contraction in an inside of the connecting coupling, when coefficients of thermal expansion of the two members are different from each other. The second stress corresponds to a stress that is generated by expansion and/or contraction of the entire electronic device, which is composed of multiple parts having different materials. The second stress is also applied to the connecting coupling, which is composed of the members having the same material. Not only the thermal stress but also the external vibration is applied to the connecting coupling. In a case that two parts are connected to each other by use of solder (a connecting member), the stress may concentrate on such connecting member because a thickness of the connecting member is relatively large.

On the other hand, according to the present embodiment, the thickness "t1" of the metal connecting layer 213 is smaller than the flatness "Fl" of the lower-side surface 211a of the metal member 211 and the flatness "Fl" of the upper-side surface 212a of the connected member 212. Since the metal connecting layer 213 has a small thickness, the metal member 211 and the connected member 212 located at a position neighboring to the metal connecting layer 213 can receive the stress. It is, therefore, possible to avoid a situation that the stress may concentrate on the metal connecting layer 213. As a result, not only a high connecting strength but also a high fatigue strength can be obtained. In addition, since the metal member 211 is connected to the connected member in the atmospheric condition at the room temperature, residual stress can be minimized.

The stress may concentrate on an end portion of the connecting portion of two members. In other words, the stress concentrates on the outer periphery of the opposing area between the two members. A metallographic structure is enlarged by the stress concentration and thereby cracks are likely to be generated. When the stressed is received by two members, corrosion may be generated in the metal member at a portion neighboring to the outer periphery of the opposing area.

According to the present embodiment, the rust-preventing film 214 is formed on the side surface 211b of the metal member 211 at the boundary portion between the metal member 211 and the metal connecting layer 213. More exactly, the rust-preventing film 214 is formed on the part of the side surface 211b of the metal member 211, wherein the rust-preventing film 214 extends from the metal connecting layer 213 to the position away from the metal connecting layer 213 by the predetermined distance. Therefore, the rust-preventing film 214 covers a predetermined surface area of the side surface 211b, to which the metal connecting layer 213 is not connected. The predetermined surface area is located at the position neighboring to the outer periphery of the opposing area. As a result, it is possible to avoid the situation by the rust-preventing film 214 that the stress may concentrate on the portion close to the end portion of the lower-side surface 211a of the metal member 211 and the corrosion may be generated at the side surface 211b of the metal member 211 neighboring to the end portion.

In the present embodiment, the area of the upper-side surface 212a of the connected member 212 is larger than that of the lower-side surface 211a of the metal member 211. In addition, the second metal film 213b formed on the upper-side surface 212a covers the entire surface of the lower-side surface 211a, when viewed them in the thickness direction. In other words, the lower-side metal film 213b covers the end portion of the opposing area in the connected member 212. The lower-side metal film 213b is a film made of the gold or the gold alloy. Therefore, in the structure in that the connected member 212 is made of metal (pure metal or metal alloy), it is possible to avoid the situation by the lower-side metal film 213b that the corrosion may be generated at the portion neighboring to the outer periphery of the opposing area. In particular, according to the present embodiment, since the lower-side metal film 213b is entirely formed on the upper-side surface 212a, it is possible to avoid the situation that the corrosion may be generated in the whole area of the upper-side surface 212a.

Second Embodiment

A second embodiment is a modification of the first embodiment.

Figure 3:
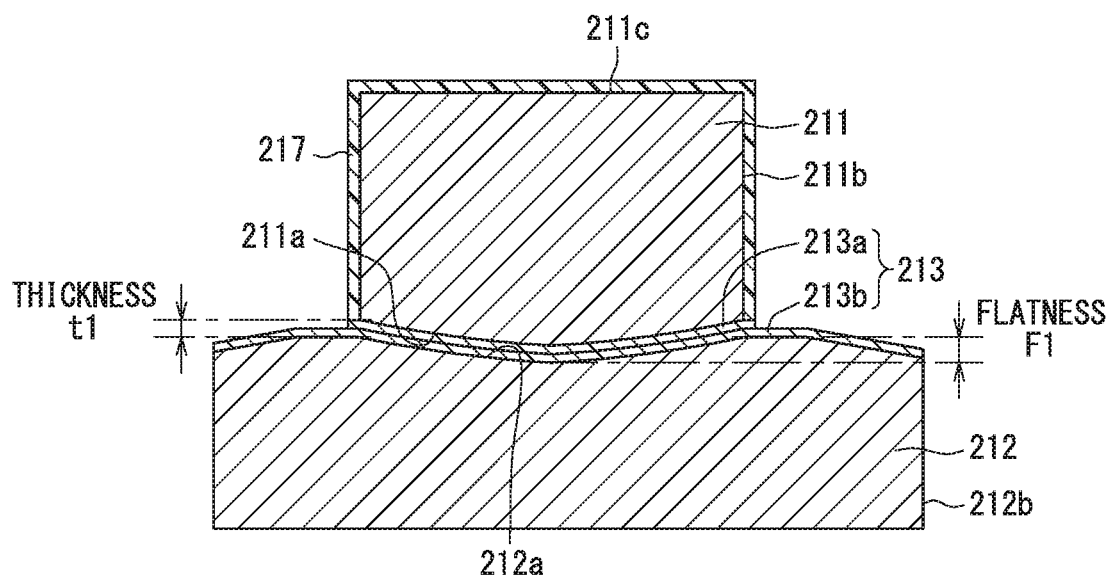
FIG. 3 is a schematic cross-sectional view showing the connecting structure in the electronic device according to a second embodiment.

As shown in FIG. 3, a rust-preventing film 217 is formed on all of the surfaces of the metal member 211 except for the lower-side surface 211a. In other words, the rust-preventing film 217 covers all of the surfaces of the metal member 211 except for the surface, on which the metal connecting layer 213 (the upper-side metal film 213a) is formed. Therefore, the rust-preventing film 217 covers all surface area of the upper-side surface 211c as well as all surface area of the side surfaces 211b of the metal member 211.

According to the second embodiment, it is possible to prevent the corrosion in a wide range of the surface areas, since the rust-preventing film 217 covers not only the part of the outer surface of the metal member 211 located at the outer periphery of the opposing area but also all of the other outer surface of the metal member 211 separated from the metal connecting layer 213.

According to the second embodiment, therefore, it is not necessary to use a mask or the like for patterning the rust-preventing film 217. It is possible to easily form the rust-preventing film 217 of the outer surface of the metal member 211.

Third Embodiment

A third embodiment is a further modification of the first embodiment.

Figure 4:
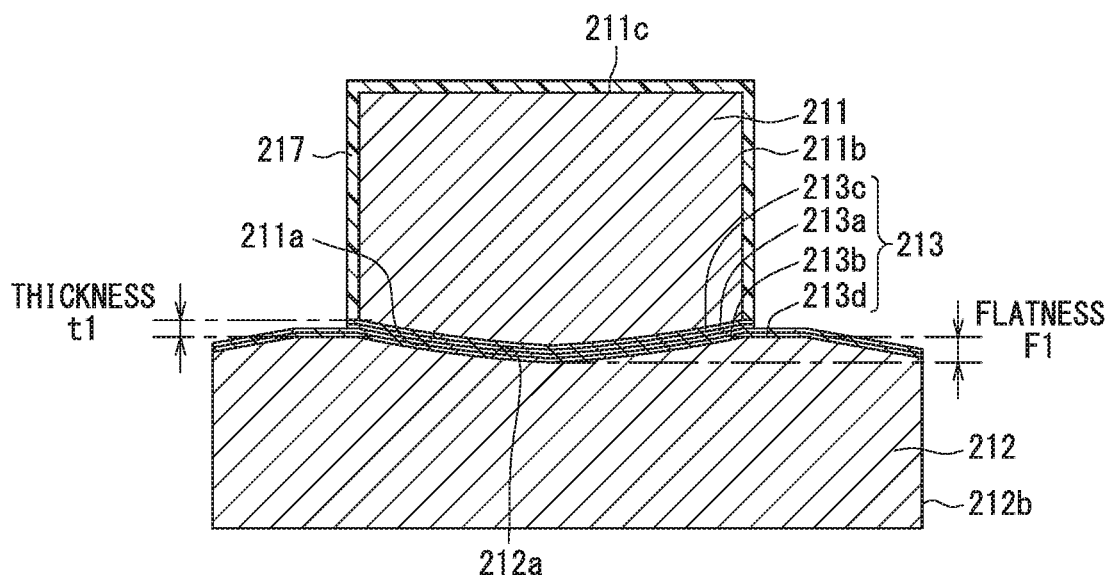
FIG. 4 is a schematic cross-sectional view showing the connecting structure in the electronic device according to a third embodiment.

As shown in FIG. 4, the metal connecting layer further include metal films 213c and 213d in addition to the metal films 213a and 213b, which are made of gold or gold alloy. The metal films 213a and 213b form a first metal film, while the metal films 213c and 213d form a second metal film. The metal films 213a, 213b, 213c and 213d are collectively referred to as a metal layer. Each of the metal films 213c and 213d is made of such material, which has a smaller coefficient of thermal expansion than that of the metal films 213a and 213b (gold or gold alloy). The metal film 213c is formed at a position between the metal film 213a and the lower-side surface 211a of the metal member 211. The metal film 213d is formed at a position between the metal film 213b and the upper-side surface 212a of the connected member 212.

Each of the metal films 213c and 213d is made of the material, which includes at least one of tantalum, tungsten, titanium and chrome. The above metal has the coefficient of thermal expansion smaller than that of gold or gold alloy. Each of the metal films 213c and 213d may be composed of a single layer made of tantalum, tungsten, titanium or chrome. Alternatively, each of the metal films 213c and 213d may be composed of multiple layers, each of which is made of tantalum, tungsten, titanium or chrome. Each of the metal films 213c and 213d is formed by the sputtering process. A thickness of each metal film 213c or 213d is equal to or smaller than that of the metal film 213a or 213b. Therefore, the thickness "t1" of the metal connecting layer 213 has a value of some nanometers (nm), for example, several tens of nanometers.

According to the present embodiment, the metal films 213c and 213d are added and the thickness "t1" of the opposing area is made to be smaller than the flatness "Fl" of the lower-side surface 211a of the metal member 211 and the flatness "Fl" of the upper-side surface 212a of the connected member 212. As a result, it is possible that the stress can be received by the portion of the metal member 211 and the portion of the connected member 212, each of which is neighboring to the metal connecting layer 213.

In addition, since the coefficient of the thermal expansion of the metal films 213c and 213d is smaller than that of the metal films 213a and 213b, it is possible to provide relief from the concentration of the stress on the outer periphery of the opposing area. It is, therefore, possible to effectively prevent corrosion of the metal member 211 by the metal connecting layer 213 together with the rust-preventing film 217.

In FIG. 4, the rust-preventing film 217 covers all of such portions of the metal member 211, which are not covered by the metal connecting layer 213. The present disclosure is not limited to the structure of FIG. 4. As explained in connection with the first embodiment (FIG. 2), the rust-preventing film 217 may cover only the part of the side surface 211b.

Fourth Embodiment

Figure 5:
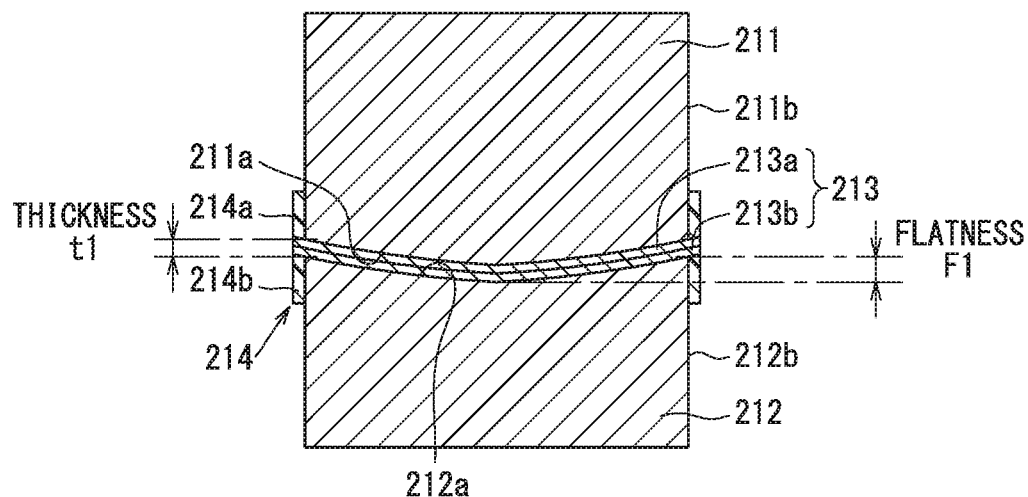
FIG. 5 is a schematic cross-sectional view showing the connecting structure in the electronic device according to a fourth embodiment.

A fourth embodiment is a still further modification of the first embodiment. As shown in FIG. 5, the connected member 212 is made of metal. The connected member 212 is made of such material, as copper, copper alloy, aluminum, aluminum alloy. The connected member 212 can be made of the same material to the metal member 211 or made of the different material from the metal member 211.

The surface area of the upper-side surface 212a of the connected member 212 is equal to that of the lower-side surface 211a of the metal member 211. When viewed the metal member 211 and the connected member 212 in the thickness direction, an outer periphery of the lower-side surface 211a of the metal member 211 coincides with an outer periphery of the upper-side surface 212a of the connected member 212. A rust-preventing film 214 includes a first rust-preventing portion 214a formed on an outer peripheral surface of the metal member 211 and a second rust-preventing portion 214b formed on an outer peripheral surface of the connected member 212. The first rust-preventing portion 214a covers a predetermined surface area of the side surface 211b of the metal member 211 in a similar manner to the rust-preventing film 214 of the first embodiment. The first rust-preventing portion 214a extends from the metal connecting layer 213 to the position having the predetermined distance therefrom. The second rust-preventing portion 214b covers a predetermined surface area of the side surface 212b of the connected member 212, in such a manner that the second rust-preventing portion 214b extends from the metal connecting layer 213 to a position having a predetermined distance therefrom.

In the case that the connected member 212 is made of the metal, the corrosion may also occur at a portion of the connected member 212, which is neighboring to the opposing area. In the present embodiment, therefore, the rust-preventing film 214 is formed on the part of the side surface 212b of the connected member 212 in such a manner that the rust-preventing film 214 (the second rust-preventing portion 214b) covers the predetermined surface area extending from a boundary with the metal connecting layer 213 (that is, the boundary with the upper-side surface 212a) to the position separated from the metal connecting layer 213 by the predetermined distance. The rust-preventing film 214 (the second rust-preventing portion 214b) covers such a portion of the side surface 212b, which is closer to the opposing area and which is not covered by the metal connecting layer 213. As a result, it is possible to avoid by the rust-preventing film 214 the situation that the stress may concentrate on the portion neighboring to the outer periphery of the upper-side surface 212a of the connected member 212 and the corrosion may occur in the side surface 212b neighboring to the outer periphery of the upper-side surface 212a. As above, it is possible to avoid the situation that the corrosion may occur in the side surfaces of the metal member 211 and the connected member 212 at such portions neighboring to the outer periphery of the opposing area.

In the present embodiment shown in FIG. 5, the rust-preventing film 214 is formed only on the part of the respective side surfaces 211b and 212b. The present disclosure is not limited to the structure of the embodiment. As shown in the second embodiment (FIG. 3), the rust-preventing film 214 may be formed on all of the outer surfaces of the respective metal member 211 and the connected member 212, except for the surface on which the metal connecting layer is formed. For example, the second rust-preventing portion 214b may be formed on all the outer surface of the connected member 212, except for the upper-side surface 212a. The present embodiment may be further modified so that the metal connecting layer 213 has additionally the metal films 213c and 213d like the third embodiment (FIG. 4).

(Further Modifications)

In the above embodiments, the metal member 211 and the connected member 212 are fixed to each other in the condition of the atmospheric pressure and the room temperature. The present disclosure is not limited to such a fixing process. The metal member 211 and the connected member 212 may be fixed to each in the vacuum state. In such a case, both of the metal films 213a and 213b may be formed. Alternatively, only one of the metal films 213a and 213b may be formed. For example, no metal film is formed on the lower-side surface 211a but the metal film 213b is formed on the upper-side surface 212a of the connected member 212. The metal member 211 having no metal film and the connected member 212 having the metal film 213b are fixed to each other in the vacuum state and at room temperature.

In the above third embodiment, the metal film 213c is formed between the metal film 213a and the lower-side surface 211a, while the metal film 213d is formed between the metal film 213b and the upper-side surface 212a. The present disclosure is not limited to such a structure. Either one of the metal films 213c and 213d may be formed. For example, in such a structure having the metal film 213b, the metal film 213d may be formed between the metal film 213b and the upper-side surface 212a and no metal film is formed between the metal film 213b and the lower-side surface 211a.

What is claimed is:

1. An electronic device comprising:
   a metal member made of metal material including one of copper, copper alloy, aluminum and aluminum alloy;

a connected member located on a lower side of the metal member and having an upper-side surface, which is opposed to a whole surface area of a lower-side surface of the metal member;

a metal connecting layer having a metal film made of metal material including gold or gold alloy, wherein the metal connecting layer connects the lower-side surface of the metal member to the upper-side surface of the connected member, and wherein a thickness of the metal connecting layer is made to be smaller than a flatness of the lower-side surface of the metal member and a flatness of the upper-side surface of the connected member; and a rust-preventing film formed on an outer side surface of the metal member and extending from an outer periphery of the metal connecting layer to a position away from the outer periphery of the metal connecting layer by a predetermined distance, wherein:

the metal member is a heat sink for a heat radiating unit of a semiconductor module having a semiconductor chip, and the connected member is an insulating plate for the heat radiating unit of the semiconductor module having the semiconductor chip.

2. The electronic device according to claim 1, wherein the rust-preventing film covers all outer surfaces of the metal member, except for the lower-side surface.

3. The electronic device according to claim 1, wherein:
the connected member is made of metal,
a surface area of the upper-side surface of the connected member is larger than that of the lower-side surface of the metal member, and
the metal connecting layer is formed on the upper-side surface of the connected member in such a way that the metal connecting layer covers all the lower-side surface of the metal member when viewed them in a thickness direction of the metal connecting layer.

4. The electronic device according to claim 1, wherein:
the connected member is made of metal,
a surface area of the upper-side surface of the connected member is equal to that of the lower-side surface of the metal member, and a rust-preventing film is further formed on an outer side surface of the connected member and extending from the outer periphery of the metal connecting layer to a position away from the outer periphery of the metal connecting layer by a predetermined distance.

5. The electronic device according to claim 1, wherein:
the metal connecting layer includes the metal film, which forms a first metal film,
the metal connecting layer includes a second metal film formed between the first metal film and one of the metal member and the connected member, and
the second metal film is made of metal material having a coefficient of thermal expansion smaller than that of the first metal film.

6. The electronic device according to claim 1, wherein:
the thickness of the metal connecting layer has a value in nanometers, and
the flatness of the lower-side surface of the metal member and the flatness of the upper-side surface of the connected member each has a value in micrometers.

7. The electronic device according to claim 1, wherein:
the thickness of the metal connecting layer has a value of several tens of nanometers, and
the flatness of the lower-side surface of the metal member and the flatness of the upper-side surface of the connected member each has a value in a range of 1 to 3 micrometers.

8. The electronic device according to claim 1, wherein the thickness of the metal connecting layer has a value in nanometers.

9. The electronic device according to claim 1, wherein the flatness of the lower-side surface of the metal member and the flatness of the upper-side surface of the connected member each has a value in micrometers.

10. The electronic device according to claim 1, wherein the thickness of the metal connecting layer has a value of several tens of nanometers.

11. The electronic device according to claim 1, wherein the flatness of the lower-side surface of the metal member and the flatness of the upper-side surface of the connected member each has a value in a range of 1 to 3 micrometers.

* * * * *